INVENTOR
LOUIS J. HEATON-ARMSTRONG
BY [signature]
ATTORNEY

Jan. 8, 1952 L. J. HEATON-ARMSTRONG 2,581,410

ELECTRIC WAVE AMPLIFIER

Filed March 3, 1949 2 SHEETS—SHEET 2

INVENTOR
LOUIS J. HEATON-ARMSTRONG
BY RPMorris
ATTORNEY

Patented Jan. 8, 1952

2,581,410

UNITED STATES PATENT OFFICE 2,581,410

ELECTRIC WAVE AMPLIFIER

Louis John Heaton-Armstrong, London, England, assignor to International Standard Electric Corporation, New York, N. Y., a corporation of Delaware Application March 3, 1949, Serial No. 79,466
In Great Britain March 5, 1948

4 Claims. (Cl. 179—171)

The present invention relates to electric wave amplifiers and is concerned with the reduction of distortion produced by grid current in amplifiers having stages operated under class B conditions.

The distortion arises from the fact that the production of grid current in a power stage of the amplifier places an additional load on the input stages which increases with the signal amplitude, so that the effective gain of the amplifier decreases with increasing signal amplitude.

According to the invention, the distortion produced by grid current in this manner is effectively removed by feeding back to an earlier stage of the amplifier in positive phase the signal envelope obtained from the grid of the power stage which grid is arranged to act as a rectifier when it is driven into the region of grid current.

In this specification the term "amplifier" may include amplifying arrangements with one or more frequency changing stages such as are commonly found in radio transmitters. It is, however, not essential that there should be any such frequency changing stages.

The invention will be described with reference to the accompanying drawings, in which.

Figure 1:
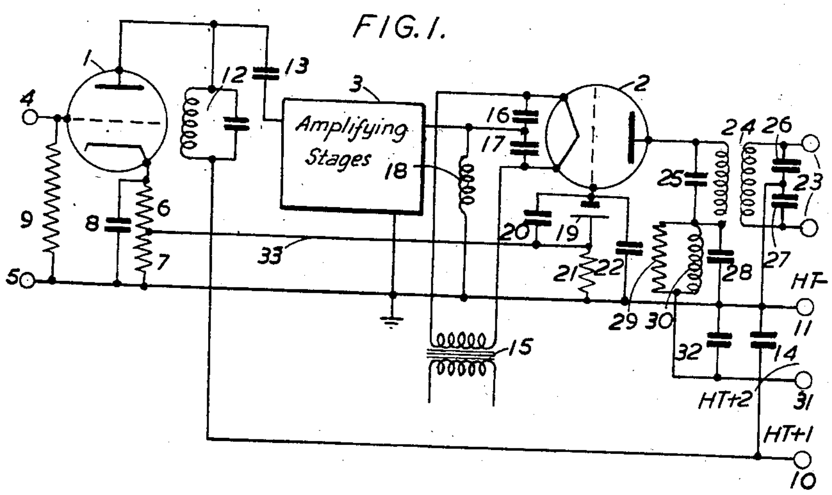
Fig. 1 shows a schematic circuit diagram of an embodiment of the invention.

Fig. 1 shows part of a high frequency amplifier including an input stage represented by a valve 1, a power output stage represented by a valve 2, which is intended to be operated under class B conditions, and any number of conventionally arranged intermediate stages represented by the block 3, of which it is not necessary to show the details. Signal modulated carrier waves will be supplied at terminals 4 and 5, of which terminal 4 is connected to the control grid of the valve 1, and 5 is grounded. The cathode of this valve is connected to ground through a bias network consisting of two resistances 6 and 7 and a shunt condenser 8. A grid leak resistance 9 is provided, and the anode is connected to the positive terminal 10 for the high tension source (not shown) (the grounded negative terminal being 11) through a parallel resonant circuit 12 tuned to the carrier frequency.

The anode of the valve 1 is also connected to the input of the amplifier stages 3 through a blocking condenser 13. A by-pass condenser 14 connects terminal 10 to ground.

The power valve 2 is provided with a directly heated filament cathode to which heating current is supplied from a transformer 15. The terminals of the filament are shunted by two equal condensers 16 and 17 in series, the common point being connected to the output of the amplifying stages 3 and also to ground through a choke coil 18. The control grid of the valve 2 is provided with a suitable negative bias source 19 shunted by a by-pass condenser 20 and connected to ground through a resistance 21. The control grid is also effectively connected to ground at carrier frequencies by the condenser 22. The anode of the valve 2 is connected to a pair of terminals 23 for the output load through a double tuned transformer 24, the primary tuning condenser being 25 and the secondary tuning condenser being divided into two equal sections 26 and 27, the common point of which is grounded. The primary winding of the transformer 24 is connected to ground through a condenser 28, and through resistance 29 shunted by an inductance coil 30 to a terminal 31 for the high tension source (not shown) for the power valve 2, which may have to supply a much higher potential than the source for the valve 1. The terminal 31 is connected to ground through a by-pass condenser 32. The elements 29 to 32 form a low-pass filter for preventing the carrier frequencies from being fed into the power source. The inductance 30 is preferably wound over the resistance 29, thereby avoiding resonances in the inductance.

Figure 2:
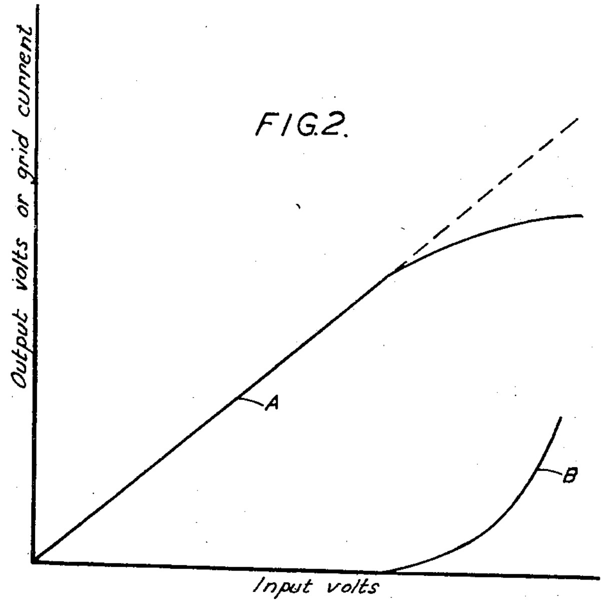
Fig. 2 shows a graph used to explain the invention.

The full line A in Fig. 2 represents the usual relation between the input voltage at terminals 4 and 5 (abcissae) and the output voltage at terminals 23 (ordinates). This line is straight up to the point at which grid current commences, as indicated by the curve B, and then bends over as a result of the additional and increasing load which the grid current effectively produces on the output of the stages 3. Part of this effect may also be due to the fact that the anode voltage swing of the valve 2 is a large fraction of the applied high tension voltage. According to the invention, this effect is substantially eliminated by connecting the upper end of resistance 21 to the junction point of the resistances 6 and 7 over conductor 33. The rectifying action of the grid is employed to produce with the aid of the elements 21 and 22 the rectified envelope of the modulated carrier wave, so that when the grid current increases, an increasing negative voltage will be applied to the cathode of the valve 1. The valve 1 should be of the kind such that an increase of the control grid potential with respect to the cathode increases the output power. Thus it will be seen that as the grid current increases, a compensating increase in the output power of the valve 1 can be produced, and the values of the resistances 6, 7 and 21 can be chosen so that the effective overall gain of the amplifier remains substantially constant.

The condenser 20 should be large, so that the impedance of the source 19 will be reduced to a negligible value at the lowest modulating signal frequency. The resistance 21 should preferably be small (for example, of the order of 20 ohms) and the condenser 22 should be of such capacity that it presents a negligible impedance at the carrier frequency, but has an impedance large compared with the resistance 21 at the highest modulating signal frequency.

In these circumstances, the control grid of the valve 2 operates as a normal rectifier, and a negative signal envelope voltage will be generated across the resistance 21. This envelope voltage is applied across resistance 7 to the cathode of the valve 1, as already explained. The resistance 7 may be, for example, about 100 ohms, while the resistance 6, which provides the majority of the bias for the valve 1, may be about 1000 ohms. The by-pass condenser 8 should have a negligible impedance, at the carrier frequency, but a relatively high impedance at the highest signal frequency.

The valve 2 has been shown operated with a grounded grid, but this is not essential, since the same principles are applicable if the class B valve is operated in the normal way, with the cathode grounded. It is simply necessary to arrange the circuit so that the grid operates as a rectifier to produce the signal envelope, and to feed back the signal envelope in positive phase to an earlier stage of the amplifier. The only requirement for the valve 2 is that the grid should not produce appreciable secondary emission, so that the grid current always increases with increase of input voltage.

It is also clearly not essential that the valve 2 should have a directly heated cathode. If an indirectly heated cathode is used, then condensers 16 and 17 are not necessary and the cathode will be connected directly to the stages 3 and to the coil 18.

Figure 3:
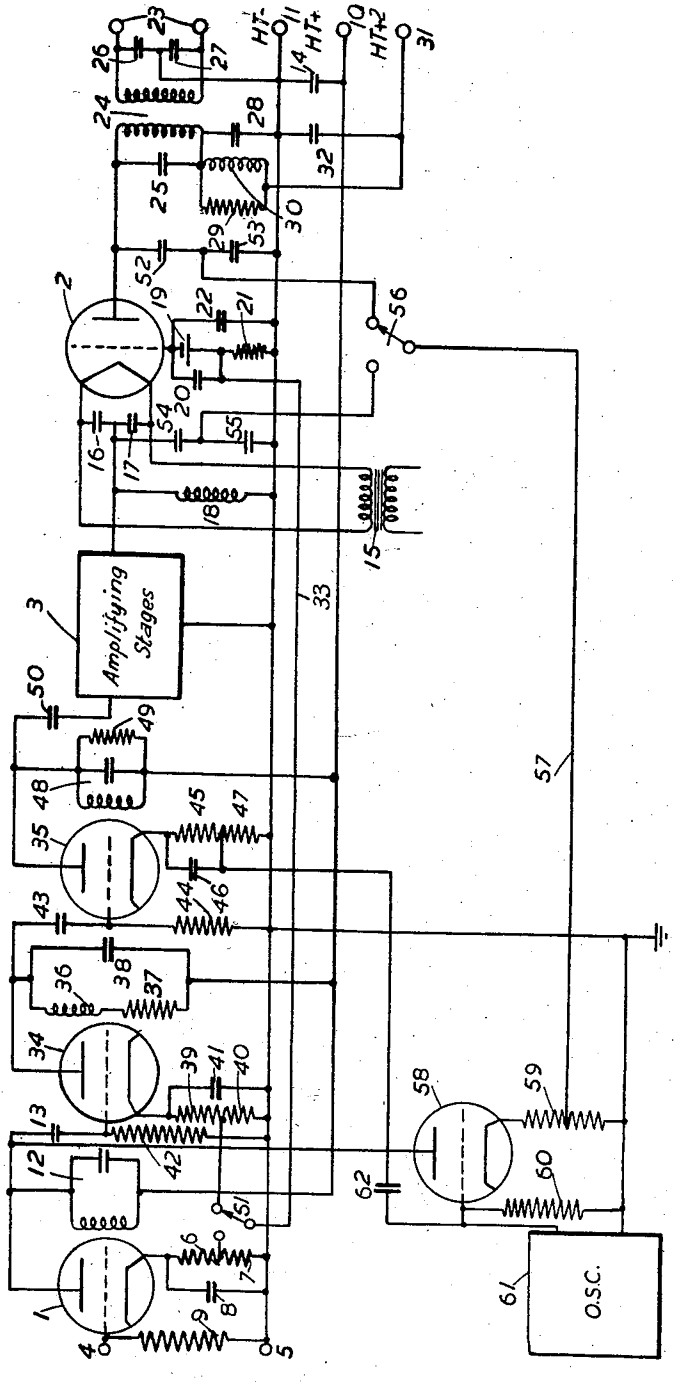
Fig. 3 shows another embodiment of the invention.

Fig. 3 shows another embodiment of the invention in which the amplifier includes a frequency changing stage, and in which negative envelope feedback is also employed, according to the principles explained in the specification of my prior application bearing Serial No. 753,149 filed June 7, 1947, now abandoned. Some of the elements in Fig. 3 are the same as corresponding elements in Fig. 1, and have been given the same designation numbers, and do not need to be explained again.

In Fig. 3, two valve stages 34 and 35 are interposed between the input valve 1 and the amplifying stages 3. The valve 34 is a phase changing valve, the anode of which is connected to terminal 10 through a phase changing network consisting of an inductance 36 in series with a resistance 37, shunted by a condenser 38. The cathode is connected to ground through a bias network consisting of two resistances 39 and 40 and a shunt condenser 41, corresponding respectively to elements 6, 7 and 8 associated with valve 1. The grid leak resistance is designated 42.

The valve 35 is a mixer or frequency changing valve, and the control grid is connected to the anode of the valve 34 through a blocking condenser 43 and to ground through a grid leak resistance 44. The cathode is connected to ground through a bias network consisting of a resistance 45 shunted by a condenser 46, and a second resistance 47. The anode is connected to terminal 19 through a parallel resonant circuit 48, shunted by a resistance 49, and to the stages 3 through a blocking condenser 50.

The conductor 33 is in this case connected to the movable contact of a two-way switch 51 by which it may be connected as desired either to the junction point of the resistances 39 and 40 associated with the phase changing valve 34, or to the junction point of the resistances 6 and 7, associated with the input valve 1.

The anode of the valve 2 is connected to ground through two condensers 52 and 53 connected in series, while the junction point of condensers 16 and 17 is connected to ground through two further condensers 54, 55 also connected in series. The junction points of condensers 52, 53 and 54, 55 are connected respectively to the fixed contacts of a second two-way switch 56. A conductor 57 connected to the movable contact of this switch leads to a second mixer or frequency changing valve 58, the anode of which is connected directly to the anode of the input valve 1. This forms the path over which negative envelope feedback is developed according to the principles explained in said prior application.

The conductor 57 is connected to an intermediate point on the resistance 59 connected in series between the cathode of the valve 58 and ground. The control grid is connected to ground through a leak resistance 60. An oscillator 61 supplies a heterodyne carrier wave to the control grid of the valve 58 and also through a blocking condenser 62 to the upper end of the resistance 47 associated with the frequency changing valve 35.

The signal supplied to terminals 4 and 5 may, for example, consist of a carrier wave of frequency 3.1 megacycles per second wide accompanied by two side bands each 6 kilocycles per second wide and possibly corresponding to two different communication channels. The oscillator 61 may supply a frequency of 17.1 megacycles per second for example. The parallel resonant circuit 12 should be tuned sharply to 3.1 megacycles, while the parallel resonant circuit 48 should preferably be broadly tuned to 20.2 megacycles thus selecting the upper sideband. The resistance 49 may be adjusted to secure sufficient breadth of tuning to avoid serious phase changes at the edges of the band as explained in the specification already referred to.

The amplified band centred in 20.2 megacycles is tapped off either at the input or at the output of the power valve 2, according to the position of the switch 56 and is fed back over conductor 57 to the mixing valve 58 which recovers the original band centred on 3.1 megacycles and applies it to the control grid of the valve 34 together with the original input band from the valve 1, but in opposite phase. The phase changing network 36, 37, 38 should be adjusted to compensate for slight variations in phase in the amplifier stages, so that the signal envelope is fed back to the valve 34 with a phase change of exactly 180°.

It will thus be seen that in addition to the positive envelope feedback supplied over conductor 33, according to the present invention and as described with reference to Fig. 1, there is supplied negative envelope feedback over conductor 57 according to the principles described in said prior application.

Each of the switches 51 and 56 could be in either position, but it is preferred that they should be set as shown in Fig. 3, since in that case the negative feedback path embraces the whole of the positive feedback path and therefore will reduce any distortion remaining after removing the effect of grid current in the power stage 2, according to the present invention.

It will be understood that although the valves have been shown as triodes for simplicity, tetrodes or pentodes may be used if desired, with the additional grids polarised in conventional ways. Furthermore, it is not essential that there should be any amplifying stages at all represented by the block 3, and if necessary for phase reversing reasons this block may be replaced by a transformer coupling.

While the principles of the invention have been described above in connection with specific embodiments, and particular modifications thereof, it is to be clearly understood that this description is made only by way of example and not as a limitation on the scope of the invention.

What is claimed is:

1. An electric wave amplifier comprising an input stage, a power stage including a tube having a grid electrode, said power stage adapted to be excited by said input stage, said grid electrode adapted to draw current when excited to a predetermined level, an alternating current bypass condenser and a resistance connected in parallel and serially connecting said grid electrode to ground, a connection between said grid electrode and said input stage for feeding back a voltage in positive phase to compensate for the additional load on said input stage caused by the drawing of current of said grid electrode.

2. An electric wave amplifier as claimed in claim 1, further comprising a negative feedback circuit coupling said output stage and said input stage whereby distortion caused by the increased output of said input stage due to the feeding back of said positive voltage is compensated for.

3. An electric wave amplifier as claimed in claim 1, wherein said condenser and said resistance present a substantially zero impedance at the frequency of the wave to be amplified.

4. An amplifier according to claim 1 in which said input stage comprises a tube having a cathode and a resistance connected between said cathode and ground, said feedback connection comprising a connection between said resistances.

LOUIS JOHN HEATON-ARMSTRONG.

REFERENCES CITED

The following references are of record in the file of this patent:

UNITED STATES PATENTS

| Number | Name | Date |
|---|---|---|
| 1,978,552 | Runge | Oct. 30, 1934 |
| 2,092,503 | Fowler | Sept. 7, 1937 |
| 2,093,564 | Klotz | Sept. 21, 1937 |
| 2,104,682 | Tellegen | Jan. 4, 1938 |
| 2,334,468 | Adams | Nov. 16, 1943 |

FOREIGN PATENTS

| Number | Country | Date |
|---|---|---|
| 520,128 | Great Britain | Apr. 16, 1940 |